United States Patent [19]
Graham et al.

[11] Patent Number: 5,724,652
[45] Date of Patent: Mar. 3, 1998

[54] METHOD FOR ACQUIRING A RAPID AUTOMATIC GAIN CONTROL (AGC) RESPONSE IN A NARROW BAND RECEIVER

[75] Inventors: David J. Graham, Davie; Dane E. Blackburn, Sunrise, both of Fla.; Kenneth A. Hansen, Round Rock, Tex.

[73] Assignee: Motorola, Inc., Schaumburg, Ill.

[21] Appl. No.: 736,177

[22] Filed: Oct. 24, 1996

[51] Int. Cl.⁶ .................................................. H04B 1/06
[52] U.S. Cl. ...................... 455/234.1; 455/240.1; 455/244.1; 375/345; 330/141
[58] Field of Search ................ 455/234.1, 234.2, 455/237.1, 239.1, 240.1, 242.1, 242.2, 244.1, 245.1, 249.1, 250.1, 254, 266; 375/345; 330/129, 141, 281

[56] References Cited

U.S. PATENT DOCUMENTS

| | | | |
|---|---|---|---|
| 5,130,668 | 7/1992 | Emslie et al. | 330/141 |
| 5,361,395 | 11/1994 | Yamamoto | 455/242.1 |
| 5,469,115 | 11/1995 | Peterzell et al. | 455/240.1 |

FOREIGN PATENT DOCUMENTS 0050678  4/1997  Japan .......................... 330/281

OTHER PUBLICATIONS

Seevinck, Evert "Analysis and Synthesis of Translinear Integrated Circuits" Elsevier—New York, 1988 p. 215.

Primary Examiner—Reinhard J. Eisenzopf
Assistant Examiner—Thanh Le
Attorney, Agent, or Firm—Val Jean F. Hillman

[57] ABSTRACT

A method for acquiring rapid automatic gain control (AGC) response in a narrow band receiver teaches opening the AGC loop (100), setting the gain control signal (106) amplitude of the AGC amplifier stage (104) to a known value, altering the gain control signal (106) amplitude over time, and monitoring the narrow band receiver for an output signal (112). Upon output signal (112) detection, halting alteration of the gain control signal (106) amplitude, closing the AGC loop (100) and commencing normal operation. A particular facet of this approach suggests detecting the output (112) with a varying gain detector (116,132) after the loop (100) is closed and before normal operations are commenced.

11 Claims, 3 Drawing Sheets

METHOD FOR ACQUIRING A RAPID AUTOMATIC GAIN CONTROL (AGC) RESPONSE IN A NARROW BAND RECEIVER

FIELD OF THE INVENTION

This invention relates in general to narrow band receivers, and in particular to narrow band zero intermediate frequency (ZIF) receivers. Specifically, this invention relates to narrow band ZIF receivers that employ automatic gain control (AGC).

BACKGROUND OF THE INVENTION

Narrow band ZIF receivers tend to have slow AGC loop settling times. This is due in part to the closed loop nature of AGC systems and the fact that narrow bandwidth filters tend to add lengthy phase delays near the filter corner frequencies, thereby placing stability limitations on the maximum loop bandwidth of an AGC loop. For narrow band ZIF receivers, AGC settling times in the 4–6 millisecond range are considered exceptional. Notwithstanding, there are several emerging applications where settling times under 2 milliseconds are required.

AGC Loops wide enough to theoretically achieve the desired settling times are typically unstable or underdamped and therefore induce excessive ripple in the AGC loop gain control signal. An alternative solution suggests switching to a faster AGC loop during settling and then switching back to the slower loop during normal operation. Unfortunately, when a fast AGC loop is switched to a slower AGC loop, ripple in the gain control signal due to fast loop tracking of the amplitude modulated (AM) signal can leave the control signal at an arbitrarily high level. Additional settling time is required to recover from this overshoot condition. As will be appreciated by those skilled in the art, this additional settling time only operates to defeat the purpose of adapting the fast loop in the first instance. For these reasons, it would be extremely advantageous to provide a method for acquiring a rapid AGC response (settling time) in a narrow band ZIF receiver.

DETAILED DESCRIPTION OF THE PREFERRED EMBODIMENT

Figure 1:
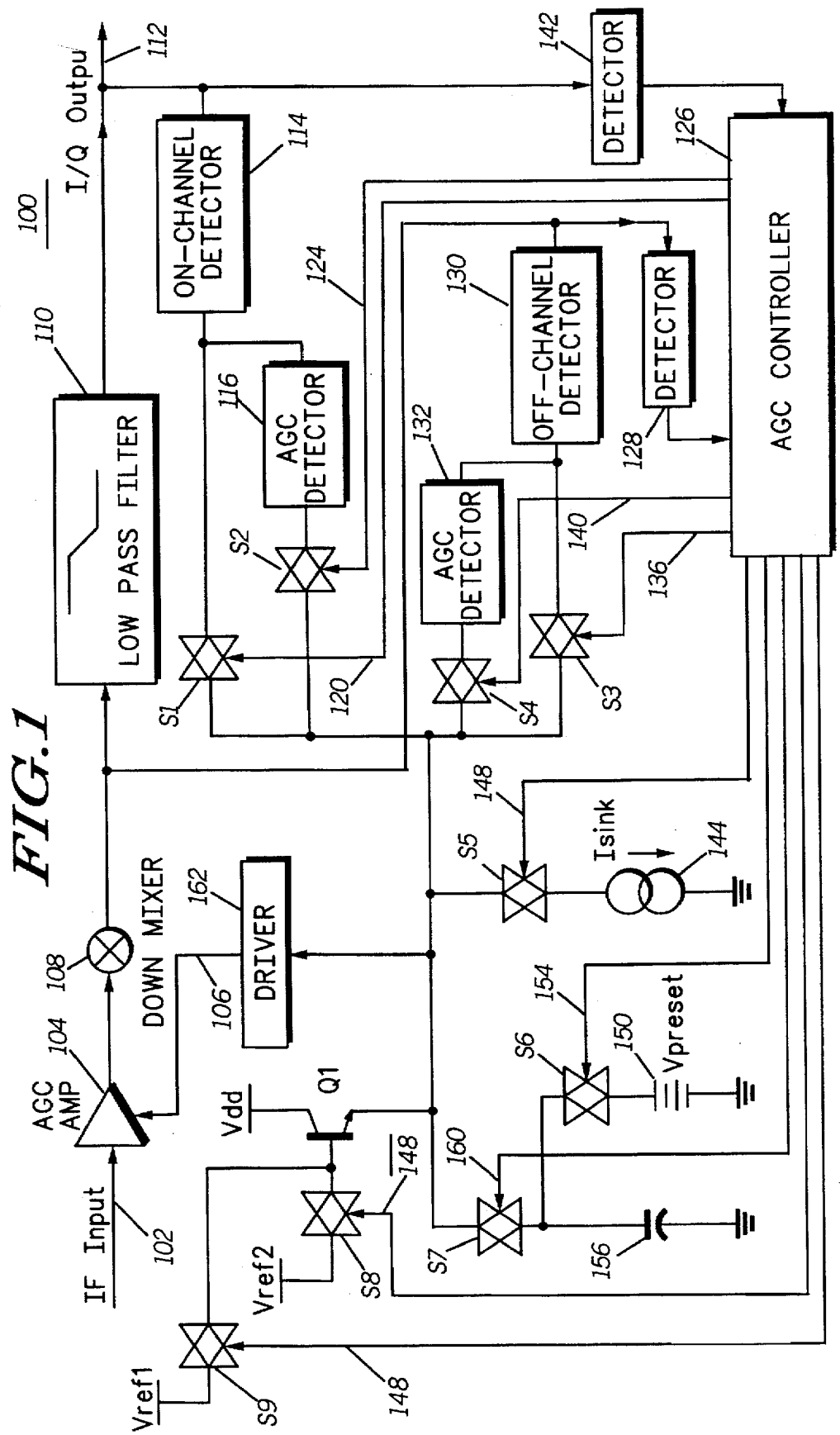
FIG. 1 is a block diagram of an AGC loop for use with a narrow band radio receiver.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a detailed block diagram of an Automatic Gain Control (AGC) loop for use with a narrow band radio receiver is shown. The AGC loop 100 includes a forward transmission path and two feed back loops coupled across the forward path. In the preferred embodiment, the forward transmission path comprises Automatic Gain Control (AGC) amplifier 104, Down Mixer 108, and Low Pass Filter (LPF) 110. The input to AGC loop 100 is an Intermediate Frequency (IF) signal 102 and the output 112 is a baseband quadrature signal 112. In the first feedback path, a voltage detector 128 at the Low Pass Filter 110 input is used to detect a signal state condition in the forward transmission path; namely signal presence and/or absence. Yet another detector 130 is used to control the amplitude of off-channel and/or adjacent-channel (undesired) signals in the forward path. A third detector 132 is used to combat any overshoot condition, as described herein in more detail. In the second feedback path a voltage detector 142 at the Low Pass Filter 110 output is used to detect a signal state condition in the forward path; namely signal presence and/or absence. Another detector 114 is used to control the amplitude of on-channel (desired) signals in the forward path. A third detector 116 is used to combat any overshoot condition, as described herein in more detail. Detectors 114 and 130 are preferably sum-of-squares (SOS) detectors which provide an output current that is proportional to the sum of the squared quadrature input voltages. In operation, the threshold point for the off-channel detector 130 is set large enough so that it will not react to the presence of on-channel signals. The on-channel detector 114 detects signals at LPF 110 output and therefore does not react to off-channel signals since they are substantially attenuated by LPF 110. The output current of the on-channel detector 114 and the off-channel detector 130 are combined and fed to AGC integrating capacitor 156 which produces the gain control signal 106 applied to AGC amplifier 104 via driver 162 in order to control the gain of AGC amplifier stage 104. Driver 162 should have a linear slope versus input power level, where the slope is defined as decibel (dB) of attenuation per amplifier volt change in gain control signal 106. The slope is expressed mathematically as dB/Volts.

As will be appreciated by those skilled in the art, after review hereof, this arrangement operates to produce a graduated degradation of on-channel signals as the level of off-channel signals increase. This is accomplished, in part, by defining the on-channel AGC threshold as the maximum desired on-channel voltage swing at the LPF 110 output. The off-channel AGC threshold is then defined as the maximum desired off-channel voltage swing at the LPF 110 input. At threshold, the net currents entering and exiting integrating capacitor 156 sum to zero, thus threshold is realized by balancing the currents into integrating capacitor 156.

In accordance with the preferred embodiment, a current sink (not shown) is employed at the output of detector 114. For on-channel detector 114, the current sink current magnitude is set such that when the detector 114 input voltage is at AGC threshold, the detector 114 output current magnitude equals the magnitude of the current sink. Conversely, if the on-channel input voltage to detector 114 is lower than the AGC threshold voltage, the detector 114 output current magnitude will be less than the magnitude of the current sink and the current from the detector 114 is a current sink. If, on the other hand, the on-channel input voltage to SOS detector 114 is larger than the AGC threshold voltage, the detector 114 output current magnitude will be greater than the magnitude of the current sink and the current from detector 114 will be a current source. The off-channel detector 130 is set up so that it only sources current in the presence of strong off-channel signals. For weak off-channel signals, the off-channel detector 130 net output current is zero.

When the composite SOS detector 114/130 sinks current, gain control signal 106 amplitude decreases. A decrease in gain control signal 106 amplitude results in decreased attenuation to input 102 by AGC amplifier stage 104.

Conversely, when the composite SOS detector 114/130 sources current, gain control signal 106 amplitude increases. An increase in gain control signal 106 amplitude results in increased attenuation to input 102 by AGC amplifier stage 104. The composite SOS detector 114/130 is arranged such that for weak on-channel signals, the SOS detector 114/130 sinks current, decreases the amplitude of gain control signal 106, decreases attenuation by AGC amplifier stage 104 and thereby increases the gain to output 112. Similarly, the composite SOS detector 114/130 is arranged such that for strong off and on-channel signals, the SOS detector 114/130 sources current, increases the amplitude of gain control signal 106, and increases attenuation by the AGC amplifier stage 104, thereby decreasing the gain to output 112. In the presence of large off-channel signals (e.g., between −50 to −20 dBm), the AGC loop 100, with dual feedback and SOS detection, will operate to limit the peak signal swing at the input to the baseband LPF 110 to within a specified range (e.g., 0.35 to 0.88 Volts-peak (Vpeak)).

A key feature of AGC loop 100 is its attack time or settling time. The attack time of an AGC loop is the period of time required for the loop to reach steady state operation in response to an arbitrary input power level. Attack times in the range between 4.0–6.0 millisecond are considered exceptional for conventional narrow band ZIF receivers. The attack time for AGC loop 100 is typically less than 1.5 milliseconds with LPF 110 bandwidth of 18 kilohertz (kHz) and AGC range in excess of 80 dB.

Figure 2:
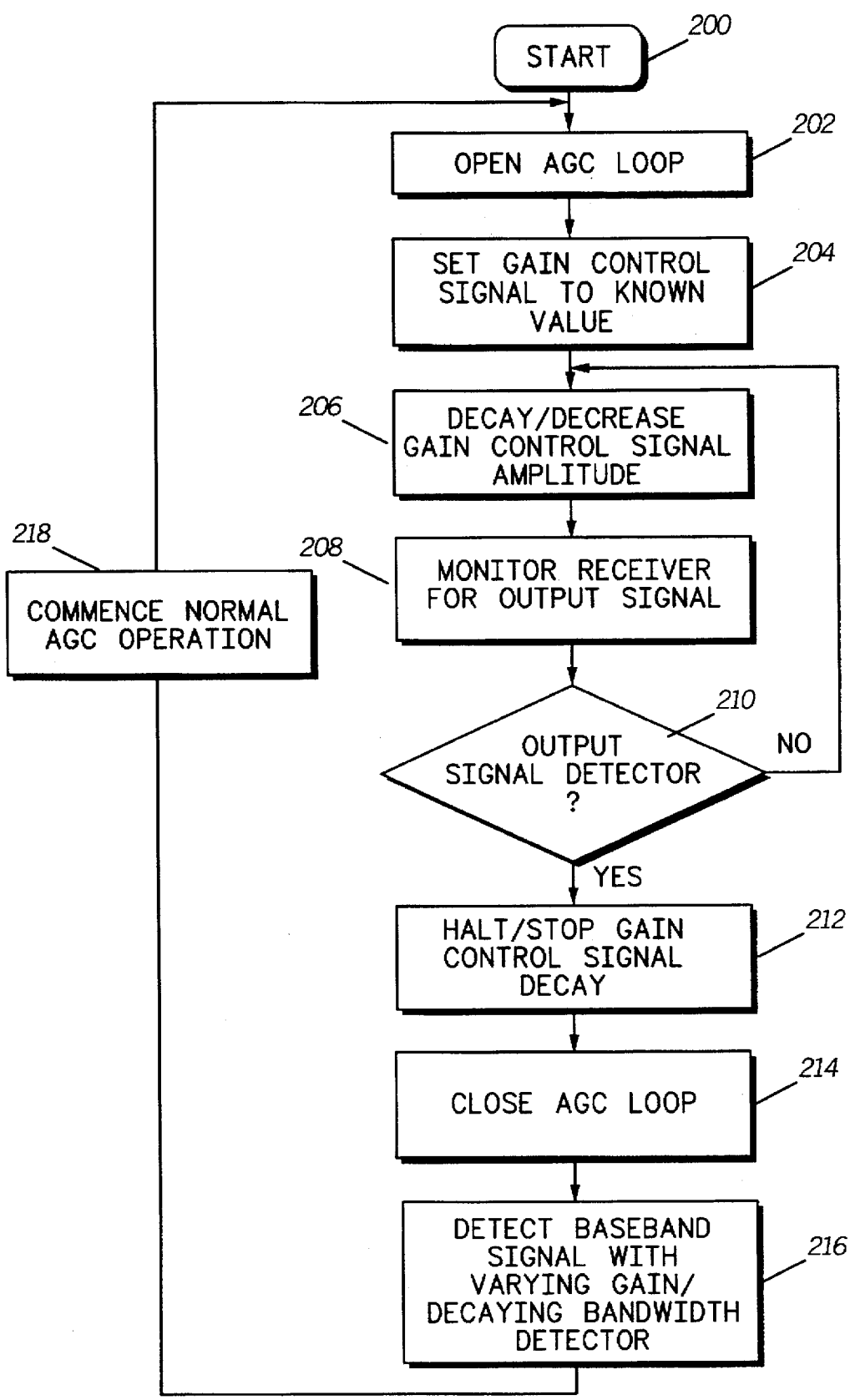
FIG. 2 is a flow chart diagram setting forth the steps for acquiring a rapid AGC response in accordance with the present invention.

The methodology employed by AGC loop 100 in order to achieve this level of performance may be referred to as "reverse AGC." Reverse merely implies that higher levels of attenuation are utilized at the beginning of the training period and are then reduced until the desired level is attained. Referring to FIG. 2, there is presented a flow chart diagram setting forth the steps performed by AGC loop 100 of FIG. 1, while under the direction and control of AGC Controller 126, in order to acquire a rapid AGC response in accordance with the present invention.

Commencing at start block 200, flow proceeds to block 202 where the AGC loop 100 is placed in open loop operation. In accordance with the preferred embodiment, this is accomplished by AGC Controller 126 opening switches S1–S4 via respective control lines 120, 124, 136, and 140. From block 202, flow proceed to block 204 where the gain control signal 106 is set to a known value. In accordance with the present invention and with reference to FIG. 1, this is accomplished by controller 126 disconnecting integrating capacitor 156 from the loop 100 via switch S7 and control line 160. Thereafter, a voltage of known amplitude is applied to gain control line 106 via voltage source 150, switch S6, and control line 154 under the control of controller 126. According to the present invention, the voltage provided by voltage source 150 corresponds to the maximum AGC attenuation available from AGC amplifier stage 104. While the present invention anticipates setting the gain of AGC amplifier 104 at maximum attenuation, it will be appreciated by those skilled in the art that other known levels of attenuation may be used as an initial setting without departing from the spirit of the present invention.

Steps 200–204 are hereinafter referred to collectively as AGC Preset. These steps may be performed at any time prior to the initialization of the AGC attack. In accordance with the present invention AGC preset is typically performed at power-up or during battery saving operations. It is worth noting, however, that AGC Preset is not intrinsically dependent upon battery saving or power-up operations.

Upon initialization of AGC attack, flow proceeds from block 204 to block 206 where the amplitude of gain control signal 106 as applied to AGC amplifier 104 is rapidly decreased. In accordance with the present invention and with reference to FIG. 1, this is accomplished by controller 126 reconnecting integrating capacitor 156 to the loop 100 via switch S7 and control line 160. Thereafter, current sink 144 is applied to gain control line 106 via driver 162, switch S5, and control line 148 under the control of controller 126. As will be appreciated by those skilled in the art, the introduction of current sink 144 operates to rapidly pull charge off integrating capacitor 156, which in turn causes a corresponding decrease in the amplitude of gain control signal 106, resulting in a corresponding fall in AGC amplifier 104 attenuation and an inversely proportional rise in AGC amplifier 104 gain. In order to assure a faster than normal settling time, the rate at which the gain control signal amplitude is decreased must be a rate that is greater than the rate of the maximum stable closed loop response of the AGC loop.

At block 208, controller 126 monitors the input and output of LPF 110 via voltage detectors 128 and 142 respectively. Detectors 128 and 142 are step response detectors. If a signal that is greater than or equal to the corresponding AGC threshold is detected at block 210, flow proceeds to block 212. Otherwise, flow loops from block 210 back to block 206 where the amplitude of gain control signal 106 is further decreased.

Upon detection of a signal that is greater than or equal to the corresponding AGC threshold level, controller 126, at block 212, forces a halt to the decay of gain control signal 106 by switchably removing the current sink signal from integrating capacitor 156 and closes the AGC loop at block 214, thereby disabling the AGC Pull-Down phase of the present invention; namely, blocks 206–214 of FIG. 2.

Due to the required pull-down speed and the inherent delay associated with baseband signal processing, the pull-down mode tends to pull the gain control signal 106 voltage lower than the optimal settling point. Thus, when the AGC loop is closed at block 214 the AGC detectors 116 and 132 of FIG. 1 must be able to quickly recover from an overshoot condition and bring the gain control signal 106 back to the desired settling point. Unfortunately, an AGC detector having a large enough gain to recover from pull-down overshoot tends to be susceptible to falsing if the output signal 112 is amplitude modulated. By falsing, it is meant that the detector may start to track the amplitude modulation in the signal and thereby distort the amplitude information as well as introduce excess ripple on the gain control signal 106. While a slower detector will produce less ripple, the recovery time from overshoot is typically too long. In accordance, an AGC detector that has a high initial gain that quickly decays over time is required. One embodiment of a such varying gain detector is disclosed in FIG. 3.

Thus, at block 216 controller 126 utilizes varying gain/decaying bandwidth AGC detectors 116 and 132 to detect on-channel and off-channel baseband signals in order to recover from anticipated overshoot. Once the loop reaches steady state operation, and prior to the receipt of information signals, controller 126, via switch S2 and control line 124 for on-channel detection and switch S4 and control line 140 for off-channel detection, removes AGC detectors 116 and 132 from the AGC loop 100 and replaces them with a constant narrow bandwidth detectors 114 and 130. Since the response shapes for detectors 128/142 are different form those exhibited by detectors 116/132 or 114/130, the feedback loops characterized by these detectors have switchably selectable response shapes to accommodate fast pull-down, overshoot recovery, and normal mode operations. It will be appreciated by those skilled in the art that the detector response shape is defined as the large signal input to output characteristic of the detector in question.

From block 216, flow proceeds to block 218, where normal AGC operation is commenced until the next AGC Preset is required. At such time, flow branches from block 218 back to block 202, where the above described AGC operation repeats.

Figure 3:
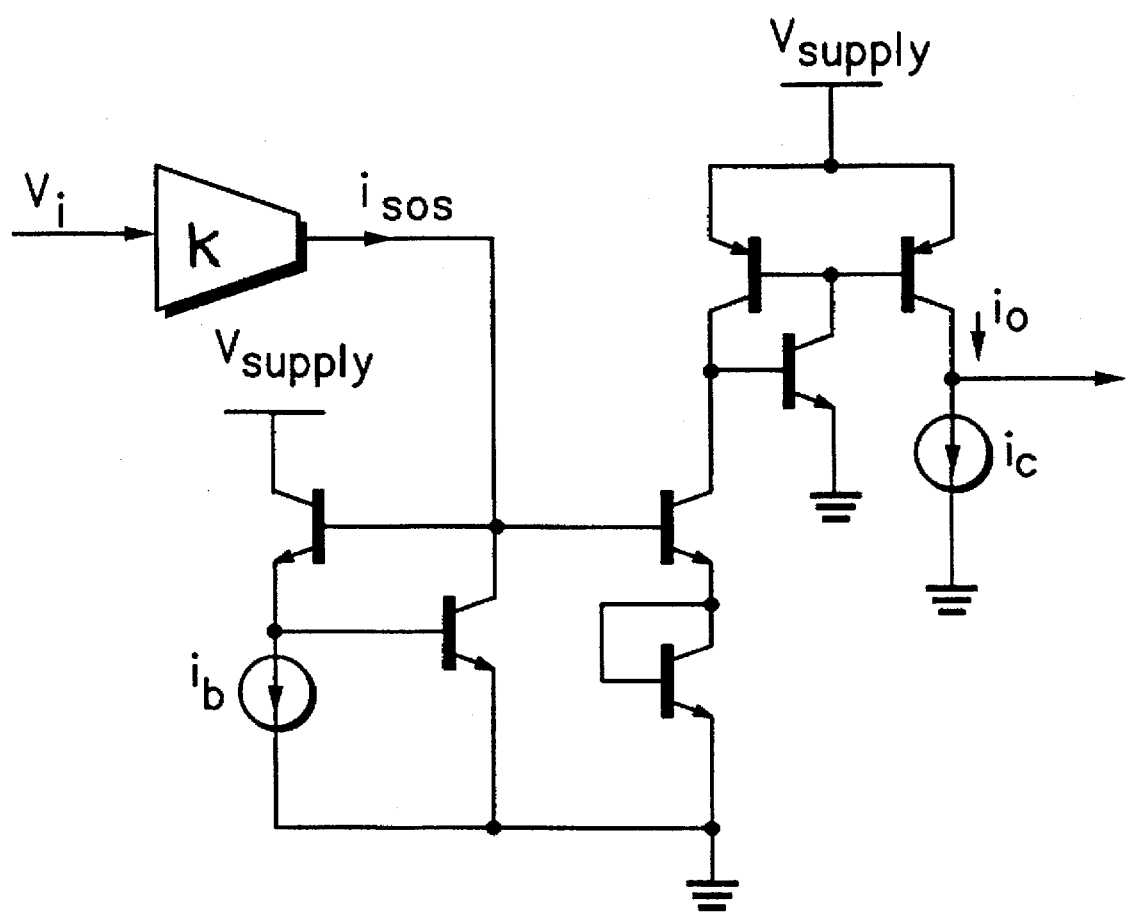
FIG. 3 is a detailed circuit diagram of the AGC detector of FIG. 1.

FIG. 3 is a detailed circuit diagram of the AGC detectors 116 and 132 of FIG. 1. These varying gain or decaying bandwidth detectors detect the baseband IF signal over a descending range of gain components moving from high to low until the settling point is reached. To assist the readers understanding the detector transfer characteristic is given by the following equation:

$$i_{sos} = kv^2_i \quad (1)$$

The small signal gain of the detector is given by:

$$gm_1 = \frac{\partial i_{sos}}{\partial v_i} \quad (2)$$

The output current of the composite detector is given by:

$$i_o = \sqrt{i_{sos}i_b} \; ; \; i_o = \sqrt{kv_i^2 i_b} = v_i \sqrt{ki_b} \quad (3)$$

The composite small signal gain is given by:

$$gm_0 = \frac{\partial i_o}{\partial v_i} = \sqrt{ki_b} \quad (4)$$

Therefore, the gain and resulting AGC bandwidth are proportional to:

$$\sqrt{i_b} \quad (5)$$

Based upon the foregoing, it will be appreciated by those skilled in the art, after review hereof, that detector 116/132 gain and resulting AGC bandwidth depends upon the value of the current $i_b$. By making the magnitude of $i_b$ decrease over time, the gain and bandwidth of the detector will decrease in an equally proportional amount over the same period of time. The rate of decrease is controlled by the slope of the decay function. In order to maintain a desired AGC threshold output reference current $i_c$ will be decreased correspondingly. An example of one shaping function for the current $i_b$ is the exponential decay characterized by discharging a capacitor through a resistor. If making $i_b$ decrease over time causes a proportional decrease in the gain of the detector and if the slope of the decay function determines the rate of the decrease, it will be appreciated by those skilled in the art that, controlling the slope of the decay function for the current $i_b$ permits additional control over the attack time of AGC loop 100 of FIG. 1. In accordance, if the slope of the shaping function for current $i_b$ is made selectable or adjustable, then an AGC loop 100 having a selectable, adjustable, or dynamic AGC attack response is achievable.

While the preferred embodiments of the invention have been illustrated and described, it will be clear that the invention is not so limited. Numerous modifications, changes, variations, substitutions and equivalents can be made by those skilled in the art without departing from the spirit and scope of the present invention as defined by the appended claims. For example, rather than reverse AGC, the opposite approach can be implemented where the AGC preset starts at a low/minimum attenuation, as opposed to the maximum attenuation start position suggested herein. Moreover, instead of a current sink 144 to provide a pull-down, a current source 144 may be utilized to alter the gain control signal amplitude and provide a pull-up function to adjust the gain control signal to its optional level. In accordance with this embodiment the receiver output will be monitored for the attenuation of the output signal. Upon detection of this output signal state, the pull-up function will be terminated. After overshoot recovery, normal mode operation will commence. In addition, a voltage clamp circuit different from the clamping circuit of FIG. 1 comprising transistor $Q_1$, switches S8 and S9, control lines 148 and $\overline{148}$ and reference voltages $V_{ref1}$ and $V_{ref2}$, can be employed to prevent the voltage supplied to integrating capacitor 156 from dropping below a specified level.

What is claimed is:

1. A method for acquiring a rapid automatic gain control (AGC) response in a narrow band receiver employing an AGC loop having a maximum stable closed loop response rate, the AGC loop having a stage for receiving a control signal having an amplitude, the method comprising the steps of:

opening the AGC loop;
   setting the control signal amplitude to a known value;
   altering the control signal amplitude;
   monitoring the narrow band receiver for a signal state;
   upon detection of the signal state;
   halting control signal amplitude alteration; and
   closing the AGC loop.

2. The method of claim 1, wherein the step of setting the control signal amplitude to a known value further includes the step of:

setting the control signal amplitude to a value corresponding to maximum stage attenuation.

3. The method of claim 1, wherein the step of altering the control signal amplitude further includes the step of:

decreasing the control signal amplitude at a rate greater than the rate of the maximum stable closed loop response of the AGC loop.

4. The method of claim 1, wherein the step of setting the control signal amplitude to a known value further includes the step of:

setting the control signal amplitude to a value corresponding to minimum stage attenuation.

5. The method of claim 1, wherein the step of altering the control signal amplitude further includes the step of:

increasing the control signal amplitude at a rate greater than the rate of the maximum stable closed loop response of the AGC loop.

6. A method for acquiring a rapid automatic gain control (AGC) response in a narrow band receiver employing an AGC loop having a maximum stable closed loop response rate, the AGC loop having a low pass filter and a gain stage, the gain stage receiving a gain control signal having an amplitude, the method comprising the steps of:

opening the AGC loop;
   setting the gain control signal amplitude to a value corresponding to maximum gain stage attenuation;
   decreasing the gain control signal amplitude at a rate greater than the maximum stable closed loop response rate;
   monitoring the narrow band receiver for an output signal;
   upon detection of the output signal;
   halting decrease of the gain control signal amplitude;
   closing the AGC loop; and
   detecting the output signal with a varying gain detector.

7. The method of claim 6, wherein the step of detecting the output signal further comprises the step of:

detecting the output signal with a decaying gain detector.

8. The method of claim 6, wherein the step of detecting the output signal further comprises the steps of:

detecting the output signal with a detector having at least a first and a second gain component, the first gain component having a higher gain than a gain of the second gain component.

9. The method of claim 6, wherein the step of detecting the output signal further comprises the steps of:

detecting the output signal with a detector having a plurality of gain components, the first gain component of said plurality of gain components having a higher gain than a remaining plurality of gain components.

10. The method of claim 6, further comprising the step of detecting a signal at the low pass filter input with the varying gain detector.

11. The method of claim 6, further comprising the step of commencing normal AGC operation after detecting the output signal with the varying gain detector.

* * * * *